United States Patent [19]

Nakakita et al.

[11] Patent Number: 4,617,250
[45] Date of Patent: Oct. 14, 1986

[54] LIGHT-SENSITIVE DIAZO COMPOSITION WITH ACIDIC COMPOUNDS FOR USE WITH LITHOGRAPHIC PRINTING PLATES

[75] Inventors: Eiji Nakakita; Akinobu Koike; Toshiyuki Sekiya; Hiroshi Misu; Nobuyuki Kita, all of Shizuoka, Japan

[73] Assignee: Fuji Photo Film Co., Ltd., Kanagawa, Japan

[21] Appl. No.: 616,040

[22] Filed: Jun. 1, 1984

[30] Foreign Application Priority Data

Jun. 1, 1983 [JP] Japan .................... 58-98684

[51] Int. Cl.$^4$ .................... G03C 1/60; G03C 1/54; G03F 7/08
[52] U.S. Cl. .................... 430/175; 430/176; 430/177; 430/178; 430/179; 430/157; 430/302
[58] Field of Search ............. 430/175, 176, 177, 178, 430/302, 157, 179

[56] References Cited

U.S. PATENT DOCUMENTS

| | | | |
|---|---|---|---|
| 2,649,373 | 8/1953 | Neugebauer et al. | 430/175 |
| 3,294,533 | 12/1966 | Sus | 430/175 |
| 3,679,419 | 7/1972 | Gillich | 430/175 |
| 4,092,170 | 5/1978 | Houtermans et al. | 430/175 |
| 4,123,276 | 10/1978 | Kita et al. | 430/176 |
| 4,186,017 | 1/1980 | Palmer | 430/175 |
| 4,294,905 | 10/1981 | Okishi et al. | 430/175 |
| 4,391,894 | 7/1983 | Shimazu et al. | 430/175 |
| 4,408,532 | 10/1983 | Incremona | 430/175 |
| 4,448,873 | 5/1984 | Walls et al. | 430/175 |
| 4,467,027 | 8/1984 | Yamamoto et al. | 430/175 |

Primary Examiner—Charles L. Bowers, Jr.
Attorney, Agent, or Firm—Sughrue, Mion, Zinn, Macpeak and Seas

[57] ABSTRACT

A light-sensitive composition for use with lithographic printing plates is described which comprises (1) a light-sensitive, organic solvent soluble and substantially water-insoluble diazo resin which is the reaction product of a water-soluble, light-sensitive condensate of an aromatic diazonium compound and an organic condensing agent with a halogenated Lewis acid or a salt thereof, (2) a substantially water-insoluble, film forming organic high-molecular weight compound having an acid value of from 10 to 200, (3) a polynuclear aromatic sulfonic acid or a salt thereof, and (4) a salt-forming organic dye compound.

4 Claims, No Drawings

LIGHT-SENSITIVE DIAZO COMPOSITION WITH ACIDIC COMPOUNDS FOR USE WITH LITHOGRAPHIC PRINTING PLATES

FIELD OF THE INVENTION

The present invention relates to a light-sensitive composition for use with lithographic printing plates. More particularly, the invention relates to a stabilized diazo light-sensitive composition having good print-out properties and improved developability.

BACKGROUND OF THE INVENTION

It is known that a lithographic printing plate having an improved receptivity to printing inks can be produced by using a light-sensitive layer made of a light-sensitive material composed of a high-molecular weight compound and a water-insoluble diazo resin. See, for example, Japanese Patent Publication No. 1167/1972, and Japanese Patent Applications (OPI) Nos. 9804/1973, 24404/1972, 38302/1972, 30604/1975, 118802/1975 and 120903/1978 (the symbol OPI as used herein means an unexamined published Japanese patent application).

The water-insoluble diazo resin used in the light-sensitive layer is in most cases an organic acid salt (typically an aromatic sulfonic acid salt) of a condensate of an aromatic diazonium compound and a carbonyl-containing organic compound. However, few light-sensitive layers made of this water-insoluble diazo resin and a high-molecular weight compound are used commercially. The reason is that a presensitized lithographic printing plate prepared by applying this light-sensitive layer to a support having a hydrophilic surface, and particularly an aluminum plate preliminarily treated to render it hydrophilic, deteriorates upon standing, and its developability is decreased to such an extent that the non-image areas are stained during printing. In order to eliminate this defect, several stabilizers have been proposed for incorporation in the light-sensitive layer such as a phosphorous acid, as described in Japanese Patent Application (OPI) No. 151023/1979; oxalic acid as described in U.S. Pat. No. 4,172,729; a halogen-containing organic phospate ester compound as described in Japanese Patent Application (OPI) No. 36207/1975 corresponding to German Patent Application (OLS) No. 2,437,408 a heterocyclic diazonium salt as described in Japanese Patent Application (OPI) No. 143405/1976, and phosphoric acid, sulfuric acid, organic sulfonic acid, polyacrylic acid, polyvinyl phosphonic acid and polyvinyl sulfonic acid, as listed in U.S. Pat. No. 3,679,419 (page 6, line 69—page 7, line 7). These compounds have proved to have the ability of stabilizing the light-sensitive layer described above when they are incorporated therein.

It is known that when a salt-forming organic compound is added as a dye to the light-sensitive layer made of a diazo resin of an organic acid salt and a high-molecular weight compound, the layer is provided with such print-out property that enables an immediate image recognition upon exposure. However, the "print-out property" of the diazo resin of an organic acid salt is weak, and this problem can be solved by using a diazo resin of a halogenated Lewis acid salt as described in U.S. Pat. No. 3,294,533 and Japanese Patent Application (OPI) No. 98613/1979.

However, it has turned out that the stabilizers listed above which would be effective for use with the diazo resin of an organic acid salt are not highly effective for use in light-sensitive layer of good "print-out" property which are made of the diazo resin of a halogenated Lewis acid salt in combination with a high-molecular weight compound.

SUMMARY OF THE INVENTION

Therefore, one object of the present invention is to eliminate the problem of staining of nonimage areas during printing (which is considered to be due to decreased developability upon standing) that is inherent in the conventional light-sensitive composition for use with lithographic printing plates of good "print-out property" that is prepared by incorporating a salt-forming, organic dye comoound in a light-sensitive layer made of a diazo resin of a halogenated Lewis acid salt and a high-molecular weight compound.

Another object of the present invention is to provide a light-sensitive composition for use with lithographic printing plates wherein the part which is exposed to light easily hardens to provide a high ink receptivity and the other part which remains unexposed easily dissolves out with a weakly alkaline aqueous solution.

We have made extensive studies to obtain these objects, and have now found that these objects can be attained by a light-sensitive composition which comprises (1) a light-sensitive, organic solvent soluble and substantially water-insoluble diazo resin which is the reaction product of a water-soluble, light-sensitive condensate of an aromatic diazonium compound and an organic condensing agent with a halogenated Lewis acid or a salt thereof, (2) a substantially water-insoluble, film forming organic high-molecular weight compound having an acid value of from 10 to 200, (3) a polynuclear aromatic sulfonic acid or a salt thereof, and (4) a salt-forming organic dye compound.

DETAILED DESCRIPTION OF THE INVENTION

The diazo resin used in the present invention is the reaction product of a water-soluble, light-sensitive condensate and a halogenated Lewis acid or a salt thereof. The water-soluble, light-sensitive condensate is produced by condensing an aromatic diazonium compound, especially a substituted or unsubstituted diphenylamine-4-diazonium salt and an organic condensing agent such as formalin or acetaldehyde. The halogenated Lewis acid has an anionic portion, such as $BF_4^-$, $PF_6^-$, $SiF_6^{--}$, $SbF_6^{--}$ or $BeF_4^{--}$. This diazo resin is light-sensitive, and soluble in organic solvents, but is substantially insoluble in water. Specific examples of this diazo resin are set forth in Japanese Patent Applications (OPI) Nos. 98613/1979 and 121031/1981, as well as U.S. Pat. No. 3,294,533. The diazo resin as used in the present invention which is substantially insoluble in water refers to a diazo resin which has a water solubility of not more than about 1 wt % at room temperature.

The substantially water-insoluble, film-forming organic high-molecular weight compound having an acid value of from 10 to 200 as used in the present invention may be any compound that is capable of dissolving or swelling in a weakly alkaline aqueous solution and which is capable of light hardening with the aid of the diazo resin characterized above. Particularly advantageous organic high-molecular weight compounds include copolymers containing acrylic acid, methacrylic acid, crotonic acid or maleic acid as the essential component, such as multi-component copolymers, as described in U. S. Patent 4,123,276 of 2-hydroxyethyl acrylate or 2-hydroxyethyl methacrylate, acrylonitrile or methacrylonitrile, and acrylic acid or methacrylic acid, and optional copolymerizable monomers; multi-component copolymers, as described in Japanese Patent Application (OPI) No. 120903/1978, of a modified acrylic acid or methacrylic acid having a terminal hydroxyl group and which is esterified with a group containing a dicarboxylic acid ester group, and acrylic acid or methacrylic acid, and optional copolymerizable monomers; multi-component copolymers, as described in Japanese Patent Application (OPI) No. 98614/1979, of a monomer having a terminal aromatic hydroxyl group (e.g. N-(4-hydroxyphenyl)methacrylamide), and acrylic acid or methacrylic acid, and optional copolymerizable monomers; and multi-component copolymers, as described in Japanese Patent Application (OPI) No. 4144/1981, of an alkyl acrylate, acrylonitrile or methacrylonitrile, and an unsaturated carboxylic acid. Other useful compounds are acidic polyvinyl alcohol derivatives and acidic cellulose derivatives. The substantially water-insoluble, high-molecular weight compound as used in the present invention refers to a high molecular weight compound which has a water solubility of not more than about 1 wt % at room temperature.

The suitable proportions of the diazo resin and high-molecular weight compound used in the light-sensitive composition of the present invention are respectively in the ranges of from 3 to 30 wt % and from 97 to 70 wt %, based on the combined total weight thereof. The smaller the proportion of the diazo resin, the higher the sensitivity that is obtained. However, if its content is less than 3 wt %, the high-molecular weight compound does not harden sufficiently with light, and the exposed light-sensitive layer swells in a developing solution and loses its film strength. If the content of the diazo resin exceeds 30 wt %, the sensitivity obtained is too low for practical purposes. More preferred ranges are from 5 to 20 wt % for the diazo resin, and from 95 to 80 wt % for the high-molecular weight compound.

The light-sensitive layer made of the diazo resin of a Lewis acid salt and the high-molecular weight compound has incorporated therein a polynuclear aromatic sulfonic acid or a salt thereof which is used to improve the stability of this layer during standing. Illustrative polynuclear aromatic sulfonic acids and salts thereof include the following: aromatic sulfonic acids (or salts thereof) having two or more phenyl groups in the molecule, or condensed polycyclic aromatic sulfonic acid (or salts thereof) such as sodium isopropylnaphthalenesulfonate, sodium t-butylnaphthalenesulfonate, disodium methylenedinaphthalenedisulfonate, sodium salts of sulfonated alkyldiphenyl oxides, sodium salts of condensed aryl sulfonates, and anionic surfactants such as those having the formula:

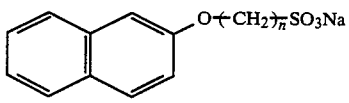

(n=1 to 10); condensed polycyclic aromatic sulfonic acids of naphthalene or anthraquinone or salts thereof such as naphthalene-1-sulfonic acid, naphthalene-2-sulfonic acid, 2,6-di-t-butylnaphthalenesulfonic acid, 2,6-di-t-butylnaphthalene-disulfonic acid, 1,8-dinitro-naphthalene-3,6-disulfonic acid, 2-diazo-1-naphthol-4-sulfonic acid, 4,4'-diazostilbene-3,3'-disulfonic acid, naphthalene-1,5-disulfonic acid, anthraquinone-2-sulfonic acid and anthraquinone-2,6-disulfonic acid; 2-methoxy-4-hydroxy-5-benzoylbenzenesulfonic acid or salts thereof; diphenyl-4-sulfonic acid or salts thereof; diphenylmethane-4-sulfonic acid or salts thereof; diphenylether-4-sulfonic acid or salts thereof; diphenylamine-4-sulfonic acid or salts thereof; diphenylsulfide-4-sulfonic acid or salts thereof; p-vinylbenzenesulfonic acid copolymers or salts thereof; sulfonated polyesters and sulfonated polyurethane of the type described in U. S. Patent 4,408,532; and a formalin condensate of p-phenolsulfonic acid of the type described in Japanese Patent Publication No. 6566/1976. The sulfonic acids listed above may be in the form of either free acids or salts. Cations forming salts with these sulfonic acids may be selected from among alkali metals such as sodium, potassium and lithium. Alternatively, the cations may be the cation portions of basic dyes such as Crystal Violet, Methyl Violet, Malachite Green, Fuchsin and Rhodamine B, as well as those cation portions of quaternary amines represented by the formulae

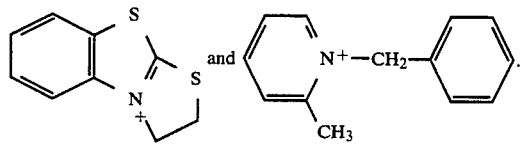

Examples of the compound having the cation portion of a basic dye are the anthraquinone-2-sulfonic acid salt of Crystal Violet, the 2-methoxy-4-hydroxy-5-benzoylbenzenesulfonic acid salt of Ethyl Violet, and the isopropylnaphthalene sulfonic acid salt of Victoria Pure Blue BOH. Other useful compounds are acidic dyes having two or more phenyl groups in the molecule, such as C.I. Acid Yellow 1, C.I. Acid Yellow 11, C.I. Acid Yellow 17, C.I. Acid Yellow 36, C.I. Acid Red 6, C.I. Acid Red 80 and C.I. Acid Blue 104.

The suitable amount of these polynuclear aromatic sulfonic acids and salts thereof ranges from 5 to 100 wt % based on the weight of the diazo resin. The amounts in this range are sufficient for causing such compounds to exhibit their intended function of stabilizing the light-sensitive composition of the present invention so that its developability will not deteriorate upon standing. As the amount of these polynuclear aromatic sulfonic acids and salts thereof becomes smaller than 5 wt % of the weight of the diazo resin, their ability to stabilize the light-sensitive layer is decreased. If their amount exceeds 100 wt % of the weight of the diazo resin and as the difference increases, a greater stability is achieved, but then the run life of the plate on the press will decrease. Optimum range is from 7 to 40 wt % of the diazo resin.

Examples of the salt-forming dyes that are incorporated in the light-sensitive composition of the present invention for the purpose of imparting good "print-out" properties include Crystal Violet (C.I. 42555), Methyl Violet 2B (C.I. 42535), Malachite Green (C.I. 42000), Fuchsin (C.I. 42510), Crystal Violet-carbinol base (C.I. 42555:1), Parafuchsin (C.I. 42500), Sudan Blue G (C.I. 61520), Acilan Brilliant Blue 5B (C.I. 42740), Acilan Violet S4BN (C.I. 42640), Astradiamant Green GX (C.I. 42040), Rhodamine B (C.I. 45170), Samaron Blue GSL (C.I. 62500), Victoria Blue B (C.I. 44045), Alizarin Direct Blue (C.I. 625055), Victoria Pure Blue BOD (C.I. 42595), Brilliant Green (C.I. 42040), Nile Blue-BX (C.I. 51185), Neutral Red (C.I. 50040), Rhosurine Pure Blue 3G (C.I. 51004), rosin resin acid salt of Victoria Pure Blue BOD, paratoluenesulfonic acid salt of Victoria Pure Blue BOD, and paratoluenesulfonic acid salt of Crystal Violet. Particularly useful examples are the salts of these basic dyes and polynuclear aromatic sulfonic acids because they function both as a stabilizer and as an agent to provide better "print-out" properties.

The salt-forming dye compounds are incorporated in the light-sensitive layer in an amount of 5 to 100 wt %, and preferably 10 to 40 wt %, based on the weight of the diazo resin. When the salt-forming dyes are used in combination with the diazo resin, the Lewis acid produced as a result of the photodegradation of the diazo resin forms salts with these dyes, which are either discolored or develop a color to provide an image having good "print-out" properties.

Various additives may be further incorporated in the light-sensitive composition of the present invention. Illustrative additives include alkyl ethers (e.g., ethyl cellulose and methyl cellulose) and fluorine-containing surfactants for providing improved coating properties; plasticizers for providing a flexible and wear-resistant coat (e.g. tricresyl phosphate, dimethyl phthalate, dibutyl phthalate, trioctyl phosphate, tributyl phosphate, tributylcitrate, polyethylene glycol and polypropylene glycol); pigments such as acridine, cyanine, styryl, triphenylmethane and phthalocyanine dyes used as colorants for rendering the image area visible after development; and common stabilizers for diazo resins (e.g. phosphoric acid, phosphorous acid, pyrophosphoric acid, oxalic acid, boric acid, toluenesulfonic acid, polyacrylic acid and copolymers thereof, polyvinylphosphonic acid and copolymers thereof, polyvinylsulfonic acid and copolymers thereof, 5-nitronaphthalene-1-phosphonic acid, 4-chlorophenoxymethylphosphonic acid, sodium phenyl-methyl-pyrazolonesulfonate, 2-phosphonobutanetricarboxylic acid-1,2,4, 1-phosphonoethanetricarboxylic acid -1,2,2, and 1-hydroxyethane-1,1-disulfonic acid). The amounts of these optional additives vary with the specific object of their use, and generally, they are used in an amount of 0.5 to 30 wt % of the total solics weight of the light-sensitive layer.

In order to prepare a presensitized lithographic printing plate using the light-sensitive composition of the present invention, the latter is first dissolved in a suitable organic solvent, and the resulting solution is applied to a support having a hydrophilic surface to provide a dry coating weight of 0.5 to 5 g/m². The concentration of the light-sensitive composition in the coating solution preferably ranges from 1 to 50 wt %. Suitable coating solvents include methyl cellosolve, ethyl cellosolve, methyl cellosolve acetate, acetone, methyl ethyl ketone, methanol, dimethylformamide, dimethylsulfoxide, ethylene dichloride, cyclohexanone, dioxane, tetrahydrofuran and mixtures thereof. These solvents and mixtures thereof may be further mixed with a small amount of water, toluene or other solvents that will not dissolve the diazo resin or high-molecular weight compound. After the sensitizer solution using these solvents is applied to the support, the web is preferably dried at a temperature between 50° C. and 120° C. The drying scheme may consist of a preliminary drying conducted at low temperatures and a subsequent drying at higher temperatures. Alternatively, the web may be directly exposed to elevated temperatures if the proper solvent and concentration of the light-sensitive composition are selected.

The lithographic printing plate having the light-sensitive layer as applied onto the support with a hydrophilic surface is first subjected to imagewise exposure, then developed with a developer solution made of a weakly alkaline aqueous solution, so as to provide a negative image in relief. Light sources suitable for use in imagewise exposure include a carbon arc lamp, mercury lamp, xenon lamp, metal halide lamp, strobe flash, and an ultraviolet laser beam. Examples of the developer suitable for use with the presensitized lithographic printing plate having the light-sensitive layer according to the present invention are described in Japanese Patent Applications (OPI) Nos. 77401/1976, 80228/1976, 44202/1978 and 52054/1980; they are weakly alkaline aqueous solutions consisting of an organic solvent having a water solubility of not more than 10 wt % at room temperature (e.g.,benzyl alcohol or ethylene glycol monophenyl ether), an alkali agent (e.g. triethanolamine or monoethanolamine), an anionic surfactant (e.g., aromatic sulfonic acid salt, dialkylsulfosuccinic acid salt, alkyl naphthalenesulfonic acid salt, a compound of one of the following formulae:

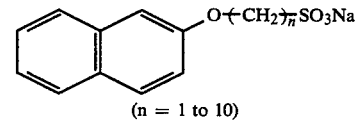

(n = 1 to 10)

and

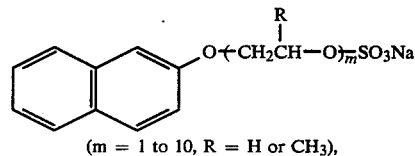

(m = 1 to 10, R = H or CH₃), or branched alkyl sulfate ester salt), water, and optionally an anti-staining agent (e.g., sodium sulfite or a sodium salt of sulfopyrazolone) and a water softener (e.g., EDTA 4Na or N-(-CH₂COONa)₃).

A particularly preferred example of the support that has a hydrophilic surface and to which the light-sensitive composition of the present invention is applied is an aluminum plate that has been preliminarily treated to render its surface hydrophilic. The surface of the aluminum plate is roughened by wire brush graining, brush graining with nylon brushes, and a slurry of abrasive grit, ball graining, chemical graining, electrolytic graining, or by complex graining using two or more of these graining methods. Preferably, the grained plate is provided with a strong passivated film by anodization with a d.c. or a.c. current flowing through sulfuric acid, phosphoric acid, oxalic acid, boric acid, chromic acid, sulfamic acid, or a mixture of these acids. The passivated film formed is sufficient to render the aluminum surface hydrophilic, but more preferably, the passivated aluminum plate is subjected to one of the following treatments: the silicate treatment (the silicate being sodium or potassium silicate) shown in U.S. Pat Nos. 2,714,066 and 3,181,461; the zirconium potassium fluoride treatment described in U.S. Pat. No. 2,946,638; the phosphomolybdate treatment described in U.S. Pat. No. 3,201,247; the polyacrylic acid treatment described in German Pat. No. 1,091,433; the polyvinyl phosphonic acid treatment described in German Pat. No. 1,134,093 and British Pat. No. 1,230,447; the phosphonic acid treatment described in Japanese Patent Publication No. 6409/1969; the phytic acid treatment described in U.S. Pat. No. 3,307,951; and the complex treatment as described in Japanese Patent Applications (OPI) Nos. 16893/1983 and 18291/1983 which uses both a hydrophilic, organic high-molecular weight compound and a divalent metal. Particularly good results are obtained if these hydrophilic treatments are conducted by a primer coat of a water-soluble polymer having a sulfonic acid group. Another method of rendering the support surface hydrophilic that can be used with the present invention is silicate electrodeposition as described in U.S. Patent No. 3,658,662.

The advantages of the present invention are hereunder described in greater detail by reference to the following working examples, whrein all percents are by weight.

SYNTHESIS 1

Ethylene glycol monomethyl ether (100 g) was heated at 100° C. in a nitrogen stream, while a liquid mixture of 2-hydroxyethyl methacrylate (23 g), acrylonitrile (27.5 g), benzyl methacrylate (43 g), methacrylic acid (6.5 g) and benzoyl peroxide (0.4 g) was added dropwise over a period of 2 hours. Fifteen minutes after the completion of the dropwise addition, ethylene glycol monomethyl ether (100 g) and benzoyl peroxide (0.1 g) were added, and the mixture was immediately subjected to reaction, which continued for 4 hours. After completion of the reaction, the mixture was diluted with methanol and the diluted solution was added to water to form a 2-hydroxyethyl methacrylate copolymer precipitate. The precipitate was vacuum-dried at 70° C. to provide a copolymer product having an acid value of 40.

SYNTHESIS 2

As in Synthesis 1, a copolymer of 2-hydroxyethyl methacrylate/acrylonitrile/ethyl methacrylate/methacrylic acid (50/20/25/5 wt % in terms of the monomers charged) was obtained. It had an acid value of 31.

SYNTHESIS 3

As in Synthesis 1, a copolymer of p-hydroxyphenyl methacrylamide/acrylonitrile/ethyl acrylate/methacrylic acid (20/35/37/8 wt % in terms of the monomers charged) was obtained. It had an acid value of 51.

SYNTHESIS 4

As in Synthesis 1, a copolymer of 2-hydroxyethyl methacrylate/acrylonitrile/ethyl acrylate/ethyl methacrylate/methacrylic acid (20/40/20/16/4 in terms of the monomers charged) was obtained. It had an acid value of 25.

SYNTHESIS 5

As in Synthesis 1, a copolymer of 2-hydroxypropyl methacrylate/acrylonitrile/methyl acrylate/acrylic acid (16/50/30/4 wt % in terms of the monomers charged) was obtained.

SYNTHESIS 6

As in Synthesis 1, a copolymer of 2-hydroxyethyl methacrylate/acrylonitrile/ethyl methacrylate/vinyl toluene/methacrylic acid (45/20/20/10/5 wt % in terms of the monomers charged) was obtained.

EXAMPLES 1 to 17

Samples of 2S aluminum plate 0.24 mm thick were degreased by immersion for 3 minutes in a 10% aqueous solution of sodium tertiary phosphate that was held at 80° C. The surface of each Al plate was then roughened by brush graining and desmutted with a 3% aqueous solution of sodium aluminate at 60° C. The Al plates were anodized for 2 minutes within 20% sulfuric acid at a current density of 2 A/dm$^2$. Thereafter, the plates were treated with a 3% aqueous solution of potassium silicate for 1 minute at 70° C.

To the aluminum plates now having a hydrophilic surface, sensitizer solutions having the diazo resins, the high-molecular weight compounds, dyes, aromatic sulfonic acids (or salts thereof) and other necessary additives (for these components, see Table 1 below) dissolved in a mixed solvent of ethylene glycol monomethyl ether (60 g), methanol (20 g) and methyl ethyl ketone (40 g) were applied. The plates were then dried at 100° C. for 2 minutes to prepare presensitized lithographic printing plates having a light-sensitive layer in a dry thickness of 1.5 g/m$^2$. Of the two diazo resins used, sample (I) was prepared by adding an aqueous solution of NaPF$_6$ to an aqueous solution of a sulfate salt of p-diazodiphenylamine and paraformaldehyde condensate and drying the resulting precipitate. This diazo resin had a PF$_6$ salt substitution of 89 mol %. The other diazo resin sample (II) was used for comparison purposes and prepared as in the syntheses of resin (I) except that NaPF$_6$ was replaced by sodium 2-methoxy-4-hydroxy-5-benzoylbenzenesulfonate.

The thus prepared presensitized lithographic printing plates were left to stand at 45° C. for 5 days and 75% relative humidity (RH). After imagewise exposure, the plates were subjected to vat development (25° C.×60 seconds) with a developer consisting of benzyl alcohol (30 g), triethanolamine (10 g), sodium isopropylnaphthalene-sulfonate (10 g), sodium sulfite (2 g), sodium nitrilotriacetate (0.5 g) and tap water (950 g). The developed plates were rinsed and provided with a protective gum film by application of gum arabic. The finished plates were set on a printing press and checked for any stain (or fouling) of the nonimage areas during printing. The results are shown in Table 1 together with the "print-out" properties as achieved after imagewise exposure.

TABLE 1

Print-out Properties of Presensitized Lithographic Printing Plate upon Exposure
after Standing at 45° C. × 75% RH, and Fouling of Nonimage Areas during Printing
*Print-out properties A: good B: insufficient

| Ex. No. | Diazo resin | High-molecular weight compound | Dye | Aromatic sulfonic acid (or salt) | Other additives | Print-out properties: | Fouling of non-image areas during printing |
|---|---|---|---|---|---|---|---|
| 1 | Diazo resin (I) 0.5 g | Copolymer of synthesis 1 5 g | Victoria Pure Blue BOH 0.15 g | sodium t-butyl-naphthalene-sulfonate 0.15 g | phosphorous acid 0.1 g | A | None |
| 2 | Diazo resin (I) 0.5 g | Copolymer of synthesis 1 5 g | Victoria Pure Blue BOH 0.15 g | anthraquinone-2-sulfonic acid 0.1 g | phosphorous acid 1.0 g | A | None |
| 3 | Diazo resin (I) 0.5 g | Copolymer of synthesis 1 5 g | Oil Blue (#603 Orient Chemical Ind. Co., Ltd. 0.15 g | Sodium isopropyl-naphthalene-sulfonate 0.15 g | phosphorous acid 0.1 g | A | None |
| 4 | Diazo resin (I) 0.5 g | Copolymer of synthesis 1 5 g | Victoria Pure Blue BOH 0.15 g | 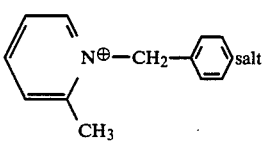 of t-butylnaphthalenesulfonic acid 0.15 g | phosphoric acid 0.1 g | A | None |
| 5 | Diazo resin (I) 0.5 g | Copolymer of synthesis 1 5 g | 2-methoxy-4-hydroxy-5-benzoyl-benzenesulfonate salt of ethyl violet: 0.30 g | | Phosphoric acid 0.1 g | A | None |
| 6 | Diazo resin (I) 0.5 g | Copolymer of synthesis 1 5 g | p-toluene-sulfonate salt of crystal violet 0.20 g | Sodium iso-propylnaphthalene-sulfonate 0.1 g | Phosphorous acid 0.1 g | A | None |
| 7 | Diazo resin (I) 0.5 g | Copolymer of synthesis 2 5 g | Victoria Pure Blue BOH 0.15 g | Sodium t-butyl-naphthalene-sulfonate 0.03 g | Phosphorous acid 0.1 g Tricresyl phosphate 0.5 g Styrene/maleic anhydride copolymer with its n-octyl alcohol moiety esterified 0.01 g | A | None |
| 8 | Diazo resin (I) 0.5 g | Copolymer of synthesis 2 5 g | Victoria Pure Blue BOH 0.15 g | Sodium anthra-quinone-2-sulfonate 0.03 g | Phosphorous acid 0.1 g Tricresyl phosphate 0.5 g Styrene/maleic anhydride copolymer with its n-octyl alcohol moiety esterified 0.01 g | A | None |
| 9 | Diazo resin (I) 0.5 g | Copolymer of synthesis 2 | Victoria Pure Blue BOH 0.15 g | 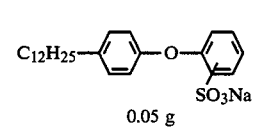 0.05 g | Styrene/maleic anhydride copolymer with its n-octyl alcohol moiety esterified 0.01 g | A | None |
| 10 | Diazo Resin (I) 0.5 g | Copolymer of synthesis 2 | 2-methoxy-4-hydroxy-5-benzoyl-benzenesulfonate salt of ethyl violet 0.03 g | | Styrene/maleic anhydride copolymer with its n-octyl | A | None |

TABLE 1-continued

Print-out Properties of Presensitized Lithographic Printing Plate upon Exposure
after Standing at 45° C. × 75% RH, and Fouling of Nonimage Areas during Printing
*Print-out properties A: good B: insufficient

| Ex. No. | Diazo resin | High-molecular weight compound | Dye | Aromatic sulfonic acid (or salt) | Other additives | Print-out properties: | Fouling of non-image areas during printing |
|---|---|---|---|---|---|---|---|
| 11 | Diazo resin (I) 0.5 g | Copolymer of synthesis 3 5 g | Victoria Pure Blue BOH 0.15 g | Sodium anthraquinone-2-sulfonic acid 0.01 g | alcohol moiety esterified 0.01 g Phosphorous acid 0.1 g Fluorine-containing surfactant (FC-430) 0.03 g Styrene/maleic anhydride copolymer having its n-butyl alcohol moiety esterified 0.1 g | A | None |
| 12 | Diazo resin (I) 0.5 g | Copolymer of synthesis 4 5 g | Victoria Pure Blue BOH 0.15 g | Sodium anthraquinone-2-sulfonic acid 0.01 g | Phosphorous acid 0.1 g Fluorine-containing surfactant (FC-430) 0.03 g Styrene/maleic anhydride copolymer having its n-butyl alcohol moiety esterified 0.1 g | A | None |
| 13 | Diazo resin (I) 0.5 g | Copolymer of synthesis 5 5 g | Victoria Pure Blue BOH 0.15 g | Sodium anthraquinone-2-sulfonic acid 0.01 g | Phosphorous acid 0.1 g Fluorine-containing surfactant (FC-430) 0.03 g Styrene/maleic anhydride copolymer having its n-butyl alcohol moiety esterified 0.1 g | A | None |
| 14 | Diazo resin (I) 0.5 g | Copolymer of synthesis 6 5 g | Victoria Pure Blue BOH 0.15 g | Sodium t-butyl-naphthalene-sulfonate 0.03 g | Phosphorous acid 0.1 g Fluorine-containing surfactant (FC-430) 0.03 g Tricresyl phosphate 0.4 g Styrene/maleic anhydride copolymer having its n-hexyl alcohol moiety esterified 0.05 g | A | None |
| 15 | Diazo resin (I) 0.5 g | Copolymer of synthesis 6 5 g | Victoria Pure Blue BOH 0.15 g | Sodium t-butyl-naphthalene-sulfonate 0.03 g | Same as in Ex. 14 except that phosphorous acid was replaced by 1.0 g of phosphoric acid | A | None |
| 16 | Diazo resin (I) 0.5 g | Copolymer of synthesis 6 5 g | Victoria Pure Blue BOH 0.15 g | Sodium t-butyl-naphthalene-sulfonate 0.03 g | Same as in Ex. 14 except that phosphorous acid was replaced by 0.03 g of pyrophosphoric acid | A | None |
| 17 | Diazo resin (I) | Copolymer of synthesis 6 5 g | Anthraquinone-2-sulfonate salt of ethyl violet 0.03 g | | Same as in Ex. 14 except that phosphorous acid | A | None |

TABLE 1-continued

Print-out Properties of Presensitized Lithographic Printing Plate upon Exposure
after Standing at 45° C. × 75% RH, and Fouling of Nonimage Areas during Printing
*Print-out properties A: good B: insufficient

| Ex. No. | Diazo resin | High-molecular weight compound | Dye | Aromatic sulfonic acid (or salt) | Other additives | Results Print-out properties: | Fouling of non-image areas during printing |
|---|---|---|---|---|---|---|---|
| | 0.5 g | | | | was replaced by 0.03 g of pyrophosphoric acid | | |
| Comp. Ex. 1 | Diazo resin (I) 0.5 g | Copolymer of synthesis 1 5 g | Victoria Pure Blue BOH 0.15 g | — | Phosphorous acid 0.1 g | A | Present |
| Comp. Ex. 2 | Diazo resin (I) 0.5 g | Copolymer of synthesis 1 5 g | p-toluenesulfonate salt of Crystal violet 0.20 g | — | Phosphoric acid 0.1 g | A | Present |
| Comp. Ex. 3 | Diazo resin (I) 0.5 g | Copolymer of synthesis 1 5 g | Oil Blue #603 (Orient Chemical Ind. Co., Ltd.) 0.15 g | Sodium dodecylbenzene sulfonate 0.10 g | Phosphorous acid 0.1 g | A | Present |
| Comp. Ex. 4 | Diazo resin (II) 0.74 g | Copolymer of synthesis 1 5 g | Oil Blue #603 (Orient Chemical Ind. Co., Ltd.) 0.15 g | — | Phosphorous acid 0.1 g | B | None |

EXAMPLE 18

In this Example, dual graining of an Al plate was performed. A sample of IS aluminum plate 0.24 mm thick was degreased by immersion for 3 minutes in a 10% aqueous solution of sodium tertiary phosphate that was held at 80° C. The surface of the Al plate was then roughened by brush graining and desmutted with a 3% aqueous solution of sodium aluminate at 60° C. The plate was then subjected to electrolytic graining in dilute nitric acid. Thereafter, the grained Al plate was anodized for 2 minutes in 20% sulfuric acid at a current density of 2 A/dm2Thereafter, the plate was treated with a 2.5% aqueous solution of sodium silicate for 1 minute at 70° C.

To the aluminum plate thus prepared, a sensitizer solution having the formulation shown below was applied, and the web was dried at 100° C. for 2 minutes to make a presensitized lithographic printing plate having a light-sensitive layer in a dry thickness of 2.5 g/m$^2$.

Sensitizer formulation

| Components | Amount |
|---|---|
| Diazo resin (I) | 0.40 g |
| Copolymer (Synthesis 2) | 5.0 g |
| Victoria Pure Blue BOH | 0.10 g |
| Sodium t-butylnaphthalenesulfonate | 0.03 g |
| Tricresyl phosphate | 0.40 g |
| Phosphorous acid | 0.08 g |
| Pyrophosphoric acid | 0.02 g |
| Fluorine-containing surfactant | 0.03 g |
| Ethylene glycol monomethyl ether | 50.0 g |
| Methanol | 16.0 g |
| Methyl ethyl ketone | 32.0 g |
| Water | 1.0 g |

The presensitized lithographic plate was placed in contact with a negative transparency and exposed imagewise for 40 seconds to a carbon arc lamp (30 A) 70 cm distant. The exposed plate was fed into a commercial automatic processor where it was developed (25° C.×50 seconds) with a developer having the formulation indicated below.

Developer formulation

| Components | Amount |
|---|---|
| Benzyl alcohol | 450 g |
| Triethanolamine | 150 g |
| Monoethanolamine | 10 g |
| 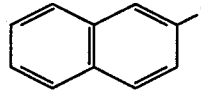 $O\text{-}(CH_2CH_2O)_{\overline{4}}SO_3Na$ | 150 g |
| Sodium sulfite | 30 g |
| Deionized water (by ion exchange) | 8420 g |

The finished plate was set on a printing plate; it was found to be capable of providing printed matter having clean nonimage areas. Furthermore, the presensitized lithographic printing plate prepared in this Example had sharp "print-out" properties after imagewise exposure.

EXAMPLE 19

Two presensitized lithographic printing plates were prepared by repeating the procedure of Example 18. For one plate, diazo resin (I) was replaced by diazo resin (III) prepared by reacting NaPF$_6$ with a diphenylamine-3-methoxy-4-diazonium salt and formaldehyde condensate, and for the other plate, diazo resin (I) was replaced by diazo resin (IV) prepared by reacting NaPF$_6$ with a diphenylamine-3'-methyl-4-diazonium salt and formaldehyde condensate. The two plates were processed as in Example 18 and set on a press for performing a printing test. The results were the same as those obtained in Example 18.

EXAMPLE 20

An aluminum plate was treated to provide a hydrophilic surface as in Example 18. It was coated with a 0.5% solution in a methanol/water mixture of a copolymer of ethyl acrylate/methyl methacrylate/CH$_2$=CH- CONHC(CH₃)₂CH₂SO₀₃Na (20/60/20 wt %) and dried at 60° C. for 1 minute to form a copolymer coat in a dry thickness of 20 mg/m². To the thus prepared support, a sensitizer solution having the formulation used in Example 1 was applied to make a presensitized lithographic printing plate having a light-sensitive layer in a dry thickness of 1.5 g/m². After imagewise exposure, the plate was developed with a developer solution having the same formulation as used in Example 1, and rinsed to remove the unexposed areas. Thus, a lithographic printing plate having clean nonimage areas was obtained.

While the invention has been described in detail and with reference to specific embodiments thereof, it will be apparent to one skilled in the art that various changes and modifications can be made therein without departing from the spirit and scope thereof.

What is claimed is:

1. A lithographic printing plate comprising a light-sensitive composition on an aluminum support which has been pre-treated to render its surface hydrophilic, wherein said light-sensitive composition comprises in admixture (1) a light-sensitive, organic solvent soluble and substantially water-insoluble diazo resin which is the reaction product of a water-soluble, light-sensitive condensate of an aromatic diazonium compound and a organic condensing agent with a halogenated Lewis acid or a salt thereof, (2) a substantially water-insoluble, film-forming organic high-molecular weight compound having an acid value of from 10 to 200, (3) a polynuclear aromatic sulfonic acid or a salt thereof, and (4) a salt-forming organic dye compound, wherein the amount of diazo resin ranges from 3 to 30 wt % and the amount of the high-molecular weight compound ranges from 97 to 70 wt %, based on the combined total weight thereof, wherein the amount of polynuclear aromatic sulfonic acid or a salt thereof ranges from 7 to 40 wt % based on the weight of the diazo resin, wherein the salt-forming organic dye compound is incorporated in the light-sensitive layer in an amount of from 5 to 100 wt % based on the weight of the diazo resin and wherein said polynuclear aromatic sulfonic acid or a salt thereof is selected from the group consisting of sodium t-butyl-naphthalenesulfonate, anthraquinone-2-sulfonic acid, sodium isopropylnaphthalenesulfonate,

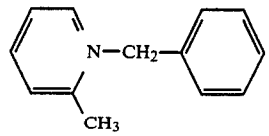

salt of t-butylnaphthalene-sulfonic acid, 2-methoxy-4-hydroxy-5-benzoylbenzene sulfonate of ethyl violet, sodium anthraquinone-2-sulfonate,

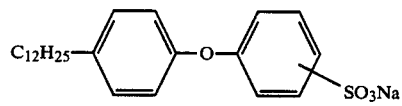

or arthraquinone-2-sulfonate salt of ethyl violet.

2. A lithographic printing plate comprising a light-sensitive composition on an aluminum support which has been pre-treated to render its surface hydrophilic as in claim 1, wherein the diazo reson compr8ises from 3 to 30 wt % and the high-molecular weight compound comprises from 97 to 70 wt %, baed on the combined total weight thereof.

3. A lithographic printing plate comprising a light-sensitive composition on an aluminum support which has been pre-treated to render its surface hydrophillic as in claim 2, wherein the salt-forming dye compound is incorporated in the light-sensitive layer in an amount of from 10 to 40 wt % based on the weight of the diazo resin.

4. A lithographic printing plate comprising a light-sensitive composition on an aluminum support which has been pre-treated to render its surface hydrophillic as in claim 1, wherein the salt-forming dye compound is incorporated in the light-sensitive layer in an amount of from 10 to 40 wt % baed on the weight of the diazo resin.

* * * * *